United States Patent [19]
Nassimi

[11] Patent Number: 5,668,702
[45] Date of Patent: Sep. 16, 1997

[54] COMBINATION AXIAL AND SURFACE MOUNT CYLINDRICAL PACKAGE CONTAINING ONE OR MORE ELECTRONIC COMPONENTS

[76] Inventor: Shary Nassimi, 2002 NW. 215 Cir., Ridgefield, Wash. 98642

[21] Appl. No.: 643,377

[22] Filed: May 6, 1996

Related U.S. Application Data

[63] Continuation-in-part of Ser. No. 230,693, Apr. 21, 1994, abandoned.

[51] Int. Cl.[6] .............. H05K 7/00; H05K 7/02; H01L 23/053; H01L 23/055
[52] U.S. Cl. .............. 361/820; 174/524; 174/260; 257/678; 257/693; 257/730; 361/760; 361/772; 361/782; 361/783; 361/807; 361/809
[58] Field of Search ............ 174/52.1, 138 G, 174/50, 52.4, 260, 261; 257/678, 687, 688, 690, 692, 693, 694, 698, 704, 723, 724, 729, 730, 731, 700, 797, 924; 338/233, 237, 226, 256, 228, 275, 232; 336/68, 208; 361/760, 766, 763, 772, 807, 809, 820, 773, 782, 783; 439/77, 70, 71, 74, 83

[56] References Cited

U.S. PATENT DOCUMENTS

| | | | |
|---|---|---|---|
| 2,464,377 | 3/1949 | Cohn et al. | 361/766 |
| 2,863,974 | 12/1958 | Zabel | 201/63 |
| 2,909,354 | 10/1959 | Bingham | 248/316 |
| 2,929,809 | 2/1960 | Wilson | 339/258 |
| 3,052,824 | 9/1962 | Haken et al. | 361/763 |
| 3,211,822 | 10/1965 | Krall | 174/35 |
| 3,222,448 | 12/1965 | Rogers | 174/35 |
| 3,279,038 | 10/1966 | Coper | 338/226 |
| 3,684,993 | 8/1972 | Hazen, III et al. | 336/208 |
| 4,187,339 | 2/1980 | Cayrol | 428/208 |
| 4,205,365 | 5/1980 | Kalina | 361/772 |
| 4,287,667 | 9/1981 | Urushiyama | 29/837 |
| 4,481,380 | 11/1984 | Wood et al. | 174/52.1 |
| 4,545,520 | 10/1985 | Kent | 228/180.1 |
| 4,641,222 | 2/1987 | Derfiny | 361/403 |
| 4,692,840 | 9/1987 | Ellis | 361/393 |
| 4,759,120 | 7/1988 | Bernstein | 29/605 |
| 4,868,637 | 9/1989 | Clements | 357/72 |
| 4,999,136 | 3/1991 | Su et al. | 252/512 |
| 5,170,323 | 12/1992 | Perretta et al. | 361/807 |
| 5,241,134 | 8/1993 | Yoo | 174/94 |
| 5,307,239 | 4/1994 | McCurty et al. | 361/704 |
| 5,319,525 | 6/1994 | Lightfoot | 361/760 |
| 5,343,366 | 8/1994 | Cipolla et al. | 361/785 |
| 5,440,452 | 8/1995 | Kitahara | 361/773 |
| 5,446,621 | 8/1995 | Jansen et al. | 361/729 |
| 5,455,744 | 10/1995 | Watanabe | 361/801 |
| 5,564,182 | 10/1996 | Nassimi | 228/180.21 |

FOREIGN PATENT DOCUMENTS

| | | | |
|---|---|---|---|
| 808494 | 2/1959 | France | 174/138 G |
| 873802 | 7/1961 | France | 174/138 G |
| 5559743 | 5/1980 | Japan . | |
| 169091 | 3/1989 | Japan . | |
| 220095 | 1/1990 | Japan . | |
| 2202091 | 8/1990 | Japan . | |
| 3-167809 | 7/1991 | Japan | 336/68 |
| 3263841 | 11/1991 | Japan . | |
| 4-65073 | 3/1992 | Japan | 439/77 |
| 4-65889 | 3/1992 | Japan | 361/760 |
| 4107980 | 4/1992 | Japan . | |
| 4132183 | 5/1992 | Japan . | |
| 872748 | 7/1961 | United Kingdom . | |

*Primary Examiner*—Donald Sparks
*Attorney, Agent, or Firm*—Richard L. Miller, P.E.

[57] ABSTRACT

A combination axial and surface mounted cylindrically-shaped package containing at least one electronic component and being surface mountable to a printed circuit board with electrical lands by the use of conventional axial component through hole mounting machinery that includes a hollow, electrically-insulated, and generally circular-cylindrically-shaped housing, at least one electronic component that is contained in the hollow, electrically-insulated, and generally circular-cylindrically-shaped housing, a pair of electrically-conductive axial leads that are in electrical communication with the at least one electronic component, and at least one circumferentially-disposed, laterally-oriented, and electrically-conductive ring also in electrical communication with the at least one electronic component.

19 Claims, 2 Drawing Sheets

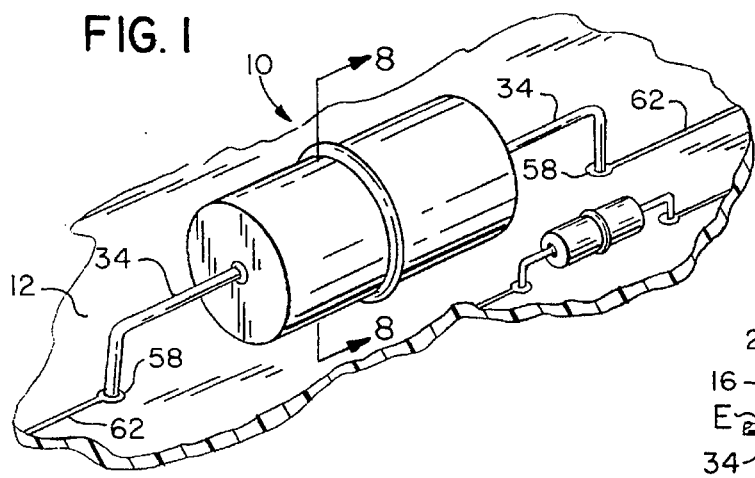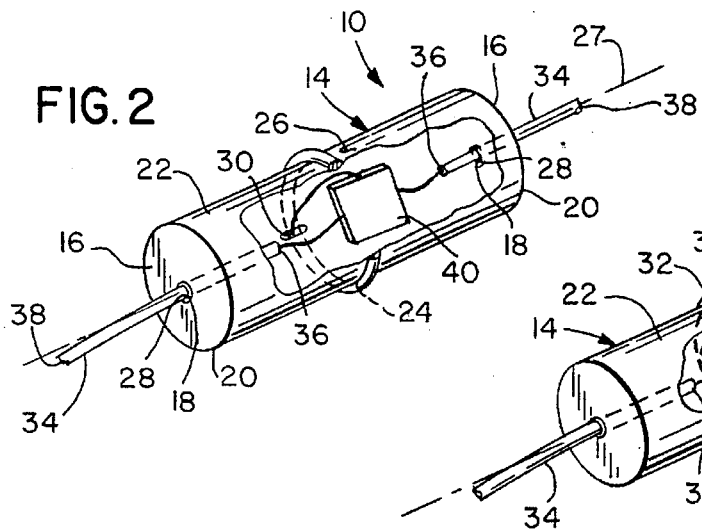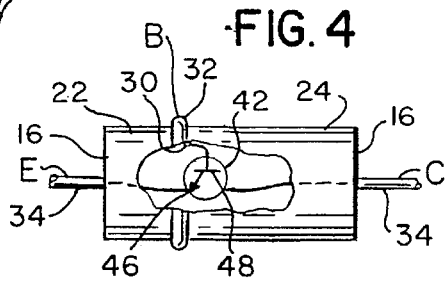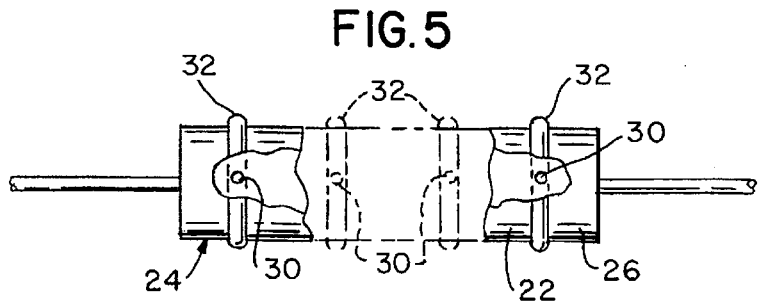

COMBINATION AXIAL AND SURFACE MOUNT CYLINDRICAL PACKAGE CONTAINING ONE OR MORE ELECTRONIC COMPONENTS

CROSS REFERENCE TO RELATED APPLICATIONS

The instant patent application is a Continuation-in-Part of patent application Ser. No. 08/230,693 filed on Apr. 21, 1994 which is to be expressly abandoned after the instant patent application is accorded a filing date.

BACKGROUND OF THE INVENTION

The present invention relates to an electronic component. More particularly, the present invention relates to a means for surface mounting at least one electronic component to a printed circuit board by using conventional cylindrically-shaped axial component through hole mounting machinery by packaging the at least one electronic component in a combination axial and surface mounted cylindrically-shaped package.

Conventional axial components have a substantially cylindrically-shaped package with only two electrically conducting leads extending outwardly from the two ends of the substantially cylindrically-shaped package along the longitudinal axis thereof.

Due to the symmetrical nature of the axial component, they bode well for automatic insertion into circuit boards since machines are readily available to accomplish this task on a large scale. For example, the axial components are arranged in a continuous belt that is feed into the insertion equipment. The insertion equipment removes each axial component from the continuous belt, bends both leads at right angles thereto, and inserts both leads into a circuit board at the desired location.

Manufacturers have long enjoyed the convenience of the axial package and have used it whenever possible. Fixed resistors, capacitors, inductors, diodes, indicator lights, and two-leaded noise suppression devices are among the many components packaged axially to exploit its inherent advantages.

To date, the components exploiting the axial packaging advantage could have no more than two electrical connections, one at each opposite end of the package. With this arrangement, electronic components such as transistors, FETs, and integrated micro-circuits, which require three or more electrical connections to other components in the circuit, were unusable for an axial environment.

Numerous innovations for electronic related devices have been provided in the prior art that will be described. Even though these innovations may be suitable for the specific individual purposes to which they address, they differ from the present invention in that they do not teach a means for surface mounting at least one electronic component to a printed circuit board by using conventional cylindrically-shaped axial component through hole mounting machinery by packaging the at least one electronic component in a combination axial and surface mounted cylindrically-shaped package.

FOR EXAMPLE, U.S. Pat. No. 2,863,974 to Zabel et al. teaches a composition resister unit having a cylindrical outer surface and stripes of color thereon indicative of resistance value. A heat conductive metallic bracket formed of a strip bent upon itself provides an attachment portion and having one end curved to present a first clamp element with a surface that closely conforms with a portion of the cylindrical surface of the resistor and the opposite end curved to present a second clamp element with a surface that closely conforms with a portion of the cylindrical surface of the resistor opposite that to which the first element conforms. The elements clampingly engages the resistor with the ends of the strip being spaced to retain visibility of the stripes of color.

ANOTHER EXAMPLE, U.S. Pat. No. 2,909,354 to Bingham teaches a mounting device that includes a base having a single aperture for receiving a rivet therethrough for securing the device to a mounting board to which the device is to be fixed. The base also includes an integral pronged portion adapted to engage the mounting board to anchor the device from rotational movement about the rivet. The device also includes, extending from the side of the base opposite the pronged portion, a pair of spaced-apart, springy, sheet metal arm that are integral with the base. Each of the pair of spaced-apart, springy, sheet metal arm each have a dihedral angled portion adapted to provide four facing component supporting surfaces for firmly engaging the component. A flange is integral with the base and extends therefrom to one side of the space encompassed by the arm surfaces.

STILL ANOTHER EXAMPLE, U.S. Pat. No. 2,924,809 to Wilson teaches a transistor clip that includes a U-shaped body having legs that are bifurcated and resilient to provide a four point contact on a component to be held. The component has a circumferential flange. A tab on the bight of the body extends in a direction opposed to the legs and into an opening in the unit that is adjacent the rail. A second tab on the bight extends in the same direction as the legs. The legs are adapted to overlie one side of the component flange and the second tab is spaced from the legs so as to overlie an end of the component on the other side of its flange.

YET ANOTHER EXAMPLE, U.S. Pat. No. 3,211,822 to Krall et al. teaches a mounting structure formed from a substantially flat sheet or strip of material having high thermal and electrical characteristics. The mounting structure includes a coiled portion for resiliently gripping the envelope of an electronic component. Another portion of the sheet of material is bent 180 degrees so as to form an inwardly projecting U-shaped flange portion for frictionally gripping the peripheral surfaces of a mounting board and for holding the electronic component in close proximity to the surface of a mounting board. The U-shaped flange portion of the mounting structure, as well as other circuit components, are flow soldered in place to the metal coated surface of the mounting board.

STILL YET ANOTHER EXAMPLE, U.S. Pat. No. 3,222,448 to Rogers et al. teaches an electrical component holder that includes a support member, a base member connected to the support member so as to define a plurality of sides wherein each of the sides has a plurality of indentations therein, an electrical component mounted between the sides of the base member and substantially surrounded by the base member, and a spring clip mounted on the base member and having a plurality of spring fingers. Each of the fingers has a tip which is completely coasted with a resilient semi-rigid material and is received in one of the plurality of indentations.

YET STILL ANOTHER EXAMPLE, U.S. Pat. No. 4,187,339 to Cayrol teaches a printed circuit that has connections formed on one of its faces by depositing beads of conductive resin on that face. The conductive beads are covered by an insulating coating, and if required, further conductive beads may be deposited on the insulating coating formed on the first beads.

STILL YET ANOTHER EXAMPLE, U.S. Pat. No. 4,287, 667 to Urushiyama teaches a method of mounting an electrical component to a printed circuit board or the like that includes the steps of inserting terminals of the electrical component through a printed circuit board, fixing the terminals extending beyond the rear surface of the printed circuit board by immersion soldering, and thereafter removing a removable portion of the printed circuit board provided under or near the electrical component and surrounded with a slit to provide an opening in the printed circuit board.

YET STILL ANOTHER EXAMPLE, U.S. Pat. No. 4,545, 520 to Kent teaches a method and system for soldering insulation coated parts that includes parts having terminals wrapped with insulation coated wire are loaded into quick clamp and release fixtures and then advanced by a conveyor through a flux applying station and then through an insulation removing and solder depositing station. Solder is pumped through a well and divided into two oppositely flowing sets of streams capped by open top housings. The hot solder flowing counter to the direction of movement of the terminals acts to melt and wash away the insulation whereafter the solder flowing in the direction of movement of the terminals acts to deposit solder on the wire wrapped terminals.

STILL YET ANOTHER EXAMPLE, U.S. Pat. No. 4,641, 222 to Derfiny et al. teaches a mounting system that provides preparations for surface mounted components and the printed circuit substrate which render the resultant assembly highly resistant to stresses which occur due to thermal cycling. The printed circuit substrate is conditioned by removing selected areas of media surrounding the points of attachment between the surface mounted component and the printed circuit media. In addition, a spacing element is disposed between the surface mounted component and the printed circuit media to promote the formation of a virtual lead during assembly.

YET STILL ANOTHER EXAMPLE, U.S. Pat. No. 4,692, 840 to Ellis teaches an electric circuit module arrangement adapted for mounting in racking that includes a number of modules secured together in side by side relationship. Interconnections between the modules are provided at one end of the module arrangement and form part of the arrangement while connectors for establishing connections with other modules outside the arrangement via a wiring arrangement separate from the module arrangement.

STILL YET ANOTHER EXAMPLE, U.S. Pat. No. 4,759, 120 to Bernstein teaches a method for surface mounting a coil wherein the coil is wound either with insulated wire or space wound with non-insulated wire and subsequently coated with a solder resist or insulating material. If insulated wire is used, the insulation is removed from the wire either during or after winding at predetermined locations to match the location of connection pads in a conductive pattern on a substrate. The coil is appropriately aligned and laid down on the substrate and an attachment technique is used to form and electrical connection between the exposed areas of wire and connection pads on the substrate. Alternatively, non-insulated wire may be used, which is space wound and coated with a solder resist or insulating material. The non-insulated wire may either be masked prior to coating or the insulating material may be removed following coating to form exposed connection locations on the coil corresponding to the location of the connection pads on the substrate. An attachment technique is then used to form an electrical connection between the exposed areas of wire and the corresponding connection pads on the substrate.

YET STILL ANOTHER EXAMPLE, U.S. Pat. No. 4,868, 637 to Clements et al. teaches an electronic device made by the method of connecting a circuit member having a plurality of laterally spaced electrically conductive terminals to a substrate including a mounting surface having a plurality of laterally spaced conductive paths. The method includes the steps of applying an adhesive including a resin having a twenty to twenty-five percent by weight content of conductive metal particles over the mounting surface of the substrate having the conductive paths wherein the resin is a dielectric preventing conductivity between the spaced metal particles therein and mounting the circuit board on the adhesive while vertically aligning the conductive terminals over preselected ones of the conductive paths. The percent by weight content of the conductive metal particle in the adhesive is concentrated between each conductive terminal and the vertically aligned conductive paths to between forty to fifty percent by weight to decrease the spacing between the metal particles allowing conductivity through the resin and making the resin uniaxially conductive vertically aligned between the conductive terminal and conductive path while the resin non-concentrated adhesive remains nonconductive between laterally spaced terminals and conductive paths.

STILL YET ANOTHER EXAMPLE, U.S. Pat. No. 4,999, 136 to Su et al. teaches an ultraviolet curable electrically conductive adhesive with low resistivity, adequate lap shear strength, good thermal stability, and very stable conductivity at high temperatures of about 100 degrees C. and high humidity. The adhesive may be applied by silk screen printing and cured by ultraviolet in about 8 seconds. The adhesive may also be used as a replacement of solder in automated surface mount technology for electronic circuit fabrication. The adhesive is a mixture of a blend of an acrylate epoxy and a urethane, a copolymer of an acrylate epoxy and a urethane, or mixtures thereof, a polyfunctional acrylate monomer, a photo-initiator, and a conductive filler.

YET STILL ANOTHER EXAMPLE, U.S. Pat. No. 5,241, 134 to Yoo teaches a modification to the prior art terminal for making a solder bond between a lead and a bond site to enhance the reliability of the solder bond. In one embodiment, this modification entails solder relief terminals which includes solder relief holes through the terminals, notches, grooves or ridges on the surface of the terminal, or bending of the terminal. In a second embodiment, this modification entails predeposit of a predetermined and controlled amount of solid solder and flux on the terminal.

STILL YET ANOTHER EXAMPLE, U.S. Pat. No. 5,307, 239 to McCarty et al. teaches an electro-mechanical module that includes a packaged electrical part having a surface which dissipates heat, and a springy frame which overlies the surface. The frame includes a pair of fasteners for catching on the package at two predetermined locations. The frame has an unstressed state in which the fasteners do not coincide with the two location. The frame is springy enough, however, to be stressed and thereby move the fasteners to the two locations and thereafter return back towards the unstressed state and catch the fasteners on the package at the two locations. To complete the module, a heat sink rests on the surface and is removably attached to the frame.

YET STILL ANOTHER EXAMPLE, U.S. Pat. No. 5,319, 525 to Lightfoot teaches a circuit assembly that includes a plurality of electronic devices mounted on a circuit board, including a matched pair of devices intended for use together in the same circuit. In order to reduce the risk of using unmatched devices at the assembly stage the pair of matched devices are joined together prior to mounting them on the circuit board. For this purpose, a simple bracket is used into which the two devices can be inserted from opposite ends by push-fitting.

STILL YET ANOTHER EXAMPLE, U.S. Pat. No. 5,343, 366 to Cipolla et al. teaches a three dimensional packaging of integrated circuit chips into stacks to form cuboid structures. Between adjacent chips in the stack, there is disposed an electrical interconnection means which is a first substrate having a plurality of conductors one end of which is electrically connected to chip contact locations and the other end of which extends to one side of the chip stack to form a plurality of pin-like electrical interconnection assemblies. The pin-like structures can be formed from projections of the first substrate having an electrical conductor on at least one side thereof extending from the side. Alternatively, the pin-like structures can be formed from conductors which cantilever from both sides of an edge of the first substrate and within which corresponding conductors from both sides are aligned and spaced apart by the first substrate thickness. The spaces contain solder and form solder loaded pin-like structures. The pin-like structures can be directly solder bonded to conductors on a second substrate surface or the pin-like structure can be adapted for insertion into apertures in the second substrate. The second substrate provides a means for electrically interconnecting a plurality of these cuboids. Preferably, the first and second substrates, such as PC board, with a resilient material therebetween which permits a heat sink to be pressed into intimate contact with an opposite side of the cuboid structures.

YET STILL ANOTHER EXAMPLE, U.S. Pat. No. 5,440, 452 to Kitahara teaches a surface mount component that includes an IC chip, and a plurality of leads extending outward from the body of the chip. The leads are interconnected by an insulating frame at their outer ends. Each of the leads is provided in the vicinity of the portion thereof joined to the frame with an outer lead portion to be electrically connected to a wiring board. The frame is integrally connected to the chip body by bridges. When the component is mounted on the surface of the wiring board, the outer lead portion of each lead is bonded to the board by a solder layer without separating off the frame.

STILL YET ANOTHER EXAMPLE, U.S. Pat. No. 5,446, 621 to Jansen et al. teaches a printed circuit board or module card of a standard size for a particular type of system wherein one or more different, smaller circuit cards or sub-modules can be selectively mounted on the module card so as to utilize a maximum of its area. The module card has openings or holes therein so as to provide component clearance and thus prevent the thickness of the modula card from reducing the maximum permissible height of the components that can be mounted on the sub-modules. In order to minimize the amount of module card area devoted to interconnecting to the sub-modules, the sub-modules plug into the module card as the sub-module is moved in a direction perpendicular to the plane of the module card rather than in a direction parallel to the plane of the module card. Circuit wiring and switching is provided on the module card to interconnect selected system connectors to the same connector on each of the sub-modules or to a different connector on each sub-module.

YET STILL ANOTHER EXAMPLE, U.S. Pat. No. 5,455, 744 to Watanabe teaches an electronic control apparatus in which each device unit is detachably mounted on an open front portion of a box-shaped main body by a press-and-clamp engaging mechanism. A nail plate is formed on both side faces of a terminal block. By engaging the nail plates with engaging holes formed in a unit main body, the terminal block can be attached to the unit main body and connected to a unit circuit board at the same time. A triangular color segment is attached to an indicator portion of each device unit for identification of its type. A palm-top type program setting unit is connected to a processing unit through lead wires. The inside circuitry of the setting unit is exposed by sliding its operation section.

STILL YET ANOTHER EXAMPLE, British Patent No. 872,748 to Warman teaches improvements relating to the mounting of electric circuit components that includes electric circuit components having projecting terminal wires being mounted on one side of an insulating mounting base by a method in which a component is positioned at the side with at least one terminal wire of the component wire lying across an aperture provided in the base, and a fixing wire is laid across such aperture at the reverse side of the base and is mechanically and electrically connected through the aperture to the terminal wire, as by welding or other process, so as to secure the component to the mounting base.

YET STILL ANOTHER EXAMPLE, Japanese Patent No. 1-69091 to Maeda teaches a printed circuit board with a recessed part that is arranged on the peripheral part of an adhesive agent spreading position. As a result, even if more than the necessary amount of the adhesive agent is spread at the time of bonding chip part, the superfluous adhesive agent is buried in the recessed part and does not reach an electrode part of the chip parts thereby enabling a sure soldering connection between the electrode of the chip parts and the wiring pattern on the printed circuit board.

STILL YET ANOTHER EXAMPLE, Japanese Patent No. 2-20095 to Yamaguchi teaches a method and structure for attaching a part using shape memory alloy that includes a terminal of a part being inserted into a terminal attaching hole of a printed wiring board. A piece of clamping wire of shape memory alloy is hooked over the part and inserted into clamping wire attaching holes of the printed wiring board. In soldering, the board is immersed into an automatic soldering bath under this state. The terminal and clamping wire are then soldered. At this time, the solder is added to the clamping wire and the clamping wire is returned back to the originally memorized shape. The wire becomes a coil state from a part which is soldered first and cannot be pulled out of the clamping wire attaching hole of the printed wiring board. The heat is subsequently conducted to a part on the side of the part on the clamping wire. The part is clamped to the printed wiring board by the returning force back to the coil state.

YET STILL ANOTHER EXAMPLE, Japanese Patent No. 2-202091 to Hirama teaches a connecting member for a surface mounting electronic component that includes an engaging piece that is engaged with a base in such a manner that it pinches the base with pressure along the underside and side face thereof. The engaging piece is provided with a through-hole which guides a lead downward that protrudes from the underside of the base. An insulation section is formed on a base section that is in contact with the base. A metallized section is deposited on a region connected to a connecting conductor on a printed circuit board. Therefore, the engaging piece is prevented from being affected by protrusions or the like on the board.

STILL YET ANOTHER EXAMPLE, Japanese Patent No. 3-263841 to Sato teaches an electronic component mounting board in which an electronic component is formed on the board and which is connected to a conductor circuit formed on a base material via bonding wires. A plurality of auxiliary pads partially exposed from the outer peripheral edge of the component and disposed at the other part at the lower side of the component are formed on the part to be mounted with the component of the material. The pads are connected to the circuit formed on the material on the opposite side to the component via through holes formed in the part to be mounted with the component. For example, through holes for conducting heat from the component directly to the lower surface of the material are formed also substantially at the center of the part to be mounted with the component.

YET STILL ANOTHER EXAMPLE, Japanese Patent No. 4-107980 to Seike teaches a structure for mounting a piezoelectric device to a circuit board that includes a metal member having a base part and a plurality of legs which extend from the base part. A metal case type piezoelectric device is mounted to the circuit board with the metal member covering same. At this time, the base part of the metal member, that has a projecting surface shape, provides elastic support for securing electrical contact with an upper surface of the metal of the piezoelectric device. A plurality of legs parts which extend from the base part are flexed downward and penetrate through holes in the circuit board where they are soldered to a ground land of the circuit board.

STILL YET ANOTHER EXAMPLE, Japanese Patent No. 4-132183 to Hirakuri teaches a single in-line type hybrid integrated circuit device and method of fitting terminal lead to a prism member thereof that includes a hybrid integrated substrate for example, and insulated substrate made of ceramics, and a predetermined pattern of conductor paste is screen printed on both main surfaces thereof, and thereafter, baking is performed to form land electrodes and a printing pattern. The printed pattern is loaded with surface mounted electron circuit parts of an integrated circuit device or the like. A prism member that includes terminal leads is fitted to one side edge of the hybrid integrated circuit substrate. The terminal leads and the land electrodes of the hybrid integrated circuit substrate are connected by reflow soldering.

FINALLY, YET STILL ANOTHER EXAMPLE, Japanese Patent No. 55-59743 to Terakado teaches an electronic part that includes ink containing a pigment for displaying polarity is applied on a circumferential surface portion of glass for sealing a glass sealing diode. Ink for reinforcing adhesive strength is applied at locations which to not stack on the applied portions. The diode is tacked on a print substrate which is provided with a wiring terminal and which is coated with adhesives. A nose portion of a lead of the diode is connected to the wiring terminal through solder by dipping the nose portion in a soldering tank.

It is apparent that numerous innovations for electronic related devices have been provided in the prior art that are adapted to be used. Furthermore, even though these innovations may be suitable for the specific individual purposes to which they address, they would not be suitable for the purposes of the present invention as heretofore described.

SUMMARY OF THE INVENTION

ACCORDINGLY, AN OBJECT of the present invention is to provide a combination axial and surface mounted cylindrically-shaped package containing at least one electronic component that avoids the disadvantages of the prior art.

STILL ANOTHER OBJECT on the present invention is to provide a combination axial and surface mounted cylindrically shaped package having three or more connections with two of the electrical connections provided by opposing axial leads and the third or more connections by the use of laterally oriented circumferentially disposed electrically conductive rings in electrical communication with the at least one internal component housed within the package.

ANOTHER OBJECT of the present invention is to provide a combination axial and surface mounted cylindrically-shaped package containing at least one electronic component that is simple and inexpensive to manufacture.

STILL ANOTHER OBJECT of the present invention is to provide a combination axial and surface mounted cylindrically-shaped package containing at least one electronic component that is simple to use.

YET ANOTHER OBJECT of the present invention is to provide a combination axial and surface mounted cylindrically-shaped package containing at least one electronic component that allows for more than two electrical connections thereto.

STILL YET ANOTHER OBJECT of the present invention is to provide a combination axial and surface mounted cylindrically-shaped package containing at least one electronic component that can be inserted into a circuit board automatically.

YET STILL ANOTHER OBJECT of the present invention is to provide a combination axial and surface mounted cylindrically-shaped package containing at least one electronic component that is compatible with axial automatic, semi-automatic, and axial preparatory machinery.

BRIEFLY STATED, STILL YET ANOTHER OBJECT of the present invention is to provide a combination axial and surface mounted cylindrically-shaped package containing at least one electronic component and being surface mountable to a printed circuit board with electrical lands by the use of conventional axial component through hole mounting machinery that includes a hollow, electrically-insulated, and generally circular-cylindrically-shaped housing, at least one electronic component, a pair of electrically-conductive axial leads, and at least one circumferentially-disposed, laterally-oriented, and electrically-conductive ring.

YET STILL ANOTHER OBJECT of the present invention is to provide a combination axial and surface mounted cylindrically-shaped package containing at least one electronic component wherein the hollow, electrically-insulated, and generally circular-cylindrically-shaped housing has a longitudinal axis, and a generally cylindrically-shaped longitudinal surface with an outer face.

STILL YET ANOTHER OBJECT of the present invention is to provide a combination axial and surface mounted cylindrically-shaped package containing at least one electronic component wherein the hollow, electrically-insulated, and generally circular-cylindrically-shaped housing replicates a conventional cylindrically-shaped axial electronic component and thereby allows a normally non-cylindrically-shaped electronic component to be packaged in the hollow, electrically-insulated, and generally circular-cylindrically-shaped housing to be surface mounted to the printed circuit board by use of the conventional axial component through hole mounting machinery.

YET STILL ANOTHER OBJECT of the present invention is to provide a combination axial and surface mounted cylindrically-shaped package containing at least one electronic component wherein the generally cylindrically-shaped longitudinal surface of the hollow, electrically-insulated, and generally circular-cylindrically-shaped housing is cylindrical and thereby allows the hollow, electrically-insulated, and generally circular-cylindrically-shaped housing that contains the at least one electronic component to be mounted to the printed circuit board with any part of the generally cylindrically-shaped longitudinal surface of the hollow, electrically-insulated, and generally circular-cylindrically-shaped housing being positioned adjacent to the printed circuit board, so that the hollow, electrically-insulated, and generally circular-cylindricallyshaped housing can be surface mounted to the printed circuit board with 360 degrees of rotational freedom about the longitudinal axis of the hollow, electrically-insulated, and generally circular-cylindrically-shaped housing.

STILL YET ANOTHER OBJECT of the present invention is to provide a combination axial and surface mounted cylindrically-shaped package containing at least one electronic component wherein the at least one electronic component is contained in the hollow, electrically-insulated, and generally circular-cylindrically-shaped housing and has a plurality of electrical terminals.

YET STILL ANOTHER OBJECT of the present invention is to provide a combination axial and surface mounted cylindrically-shaped package containing at least one electronic component wherein the pair of electrically-conductive axial leads extend outwardly from the hollow, electrically-insulated, and generally circular-cylindrically-shaped housing along the longitudinal axis of the hollow, electrically-insulated, and generally circular-cylindrically-shaped housing and are in electrical communication with at least a portion of the plurality of electrical terminals of the at least one electronic component that is contained in the hollow, electrically-insulated, and generally circular-cylindrically-shaped housing.

STILL YET ANOTHER OBJECT of the present invention is to provide a combination axial and surface mounted cylindrically-shaped package containing at least one electronic component wherein the pair of electrically-conductive axial leads are in electrical communication with the electrical lands of the printed circuit board, so that the at least a portion of the plurality of electrical terminals of the at least one electronic component that is contained in the hollow, electrically-insulated, and generally circular-cylindrically-shaped housing is in electrical communication with the electrical lands of the printed circuit board.

YET STILL ANOTHER OBJECT of the present invention is to provide a combination axial and surface mounted cylindrically-shaped package containing at least one electronic component wherein the at least one circumferentially-disposed, laterally-oriented, and electrically-conductive ring is positioned on, concentric with, and encircles the outer face of the longitudinal surface of the hollow, electrically-insulated, and generally circular-cylindrically-shaped housing and is in electrical communication with at least a portion of a remaining portion of the plurality of electrical terminals of the at least one electronic component that is contained in the hollow, electrically-insulated, and generally circular-cylindrically-shaped housing.

STILL YET ANOTHER OBJECT of the present invention is to provide a combination axial and surface mounted cylindrically-shaped package containing at least one electronic component wherein the at least one circumferentially-disposed, laterally-oriented, and electrically-conductive ring is in electrical communication with the electrical lands of the printed circuit board, so that the at least a portion of the remaining portion of the plurality of electrical terminals of the at least one electronic component that is contained in the hollow, electrically-insulated, and generally circular-cylindrically-shaped housing is in electrical communication with the electrical lands of the printed circuit board.

YET STILL ANOTHER OBJECT of the present invention is to provide a combination axial and surface mounted cylindrically-shaped package containing at least one electronic component wherein the hollow, electrically-insulated, and generally circular-cylindrically-shaped housing has a pair of opposing, substantially parallel, and generally circular-shaped ends with centers and perimeters.

STILL YET ANOTHER OBJECT of the present invention is to provide a combination axial and surface mounted cylindrically-shaped package containing at least one electronic component wherein the generally cylindrically-shaped longitudinal surface of the hollow, electrically-insulated, and generally circular-cylindrically-shaped housing extends from the perimeter of one end of the pair of opposing, substantially parallel, and generally circular-shaped ends of the hollow, electrically-insulated, and generally circular-cylindrically-shaped housing to the perimeter of another end of the pair of opposing, substantially parallel, and generally circular-shaped ends of the hollow, electrically-insulated, and generally circular-cylindrically-shaped housing.

YET STILL ANOTHER OBJECT of the present invention is to provide a combination axial and surface mounted cylindrically-shaped package containing at least one electronic component wherein each of the pair of opposing, substantially parallel, and generally circular-shaped ends of the hollow, electrically-insulated, and generally circular-cylindrically-shaped housing is selected from the group consisting of flat, hemispherical, and conical.

STILL YET ANOTHER OBJECT of the present invention is to provide a combination axial and surface mounted cylindrically-shaped package containing at least one electronic component wherein the generally cylindrically-shaped longitudinal surface of the hollow, electrically-insulated, and generally circular-cylindrically-shaped housing has a midpoint that is disposed midway between the pair of opposing, substantially parallel, and generally circular-shaped ends of the hollow, electrically-insulated, and generally circular-cylindrically-shaped housing.

YET STILL ANOTHER OBJECT of the present invention is to provide a combination axial and surface mounted cylindrically-shaped package containing at least one electronic component wherein the longitudinal axis of the hollow, electrically-insulated, and generally circular-cylindrically-shaped housing extends through the centers of the pair of opposing, substantially parallel, and generally circular-shaped ends of the hollow, electrically-insulated, and generally circular-cylindrically-shaped housing.

STILL YET ANOTHER OBJECT of the present invention is to provide a combination axial and surface mounted cylindrically-shaped package containing at least one electronic component wherein each end of the pair of opposing, substantially parallel, and generally circular-shaped ends of the hollow, electrically-insulated, and generally circular-cylindrically-shaped housing has a centrally-disposed throughbore that extends therethrough at the center of each of the pair of opposing, substantially parallel, and generally circular-shaped ends of the hollow, electrically-insulated, and generally circular-cylindrically-shaped housing and are in alignment with the longitudinal axis of the hollow, electrically-insulated, and generally circular-cylindrically-shaped housing.

YET STILL ANOTHER OBJECT of the present invention is to provide a combination axial and surface mounted cylindrically-shaped package containing at least one electronic component wherein the generally cylindrically-shaped longitudinal surface of the hollow, electrically-insulated, and generally circular-cylindrically-shaped housing further has at least one throughbore disposed therein and that extends therethrough.

STILL YET ANOTHER OBJECT of the present invention is to provide a combination axial and surface mounted cylindrically-shaped package containing at least one electronic component wherein the at least one circumferentially-disposed, laterally-oriented, and electrically-conductive ring covers a respective at least one throughbore in the generally cylindrically-shaped longitudinal surface of the hollow, electrically-insulated, and generally circular-cylindrically-shaped housing.

YET STILL ANOTHER OBJECT of the present invention is to provide a combination axial and surface mounted cylindrically-shaped package containing at least one electronic component wherein the at least one circumferentially-disposed, laterally-oriented, and electrically-conductive ring is disposed at the midpoint of the generally cylindrically-shaped longitudinal surface of the hollow, electrically-insulated, and generally circular-cylindrically-shaped housing.

STILL YET ANOTHER OBJECT of the present invention is to provide a combination axial and surface mounted cylindrically-shaped package containing at least one electronic component wherein each lead of the pair of electrically-conductive axial leads has an interior end and an exterior end and passes axially through, and is sealed to, a respective centrally-disposed throughbore in the pair of opposing, substantially parallel, and generally circular-shaped ends of the hollow, electrically-insulated, and generally circular-cylindrically-shaped housing with the interior end of each of the pair of electrically-conductive axial leads disposed in the hollow, electrically-insulated, and generally circular-cylindrically-shaped housing and with the exterior end of each of the pair of electrically-conductive axial leads disposed outside the hollow, electrically-insulated, and generally circular-cylindrically-shaped housing.

YET STILL ANOTHER OBJECT of the present invention is to provide a combination axial and surface mounted cylindrically-shaped package containing at least one electronic component wherein the at least one electronic component that is contained in the hollow, electrically-insulated, and generally circular-cylindrically-shaped housing is in electrical communication with the at least one circumferentially-disposed, laterally-oriented, and electrically-conductive ring, via the at least one throughbore in the generally cylindrically-shaped longitudinal surface of the hollow, electrically-insulated, and generally circular-cylindrically-shaped housing.

STILL YET ANOTHER OBJECT of the present invention is to provide a combination axial and surface mounted cylindrically-shaped package containing at least one electronic component wherein the at least one electronic component that is contained in the hollow, electrically-insulated, and generally circular-cylindrically-shaped housing being also in electrical communication with the interior end of each lead of the pair of electrically-conductive axial leads.

YET STILL ANOTHER OBJECT of the present invention is to provide a combination axial and surface mounted cylindrically-shaped package containing at least one electronic component wherein the at least one electronic component that is contained in the hollow, electrically-insulated, and generally circular-cylindrically-shaped housing is a bipolar transistor with a base, an emitter, and a collector.

STILL YET ANOTHER OBJECT of the present invention is to provide a combination axial and surface mounted cylindrically-shaped package containing at least one electronic component wherein the base of the bipolar transistor is in electrical communication with at least one of the at least one circumferentially-disposed, laterally-oriented, and electrically-conductive ring, via a corresponding at least one throughbore in the generally cylindrically-shaped longitudinal surface of the hollow, electrically-insulated, and generally circular-cylindrically-shaped housing.

YET STILL ANOTHER OBJECT of the present invention is to provide a combination axial and surface mounted cylindrically-shaped package containing at least one electronic component wherein the emitter of the bipolar transistor is in electrical communication with one lead of the pair of electrically-conductive axial leads, via the interior end of the one lead of the pair of electrically-conductive axial leads.

STILL YET ANOTHER OBJECT of the present invention is to provide a combination axial and surface mounted cylindrically-shaped package containing at least one electronic component wherein the collector of the bipolar transistor is in electrical communication with another lead of the pair of electrically-conductive axial leads, via the interior end of the another lead of the pair of electrically-conductive axial leads.

YET STILL ANOTHER OBJECT of the present invention is to provide a combination axial and surface mounted cylindrically-shaped package containing at least one electronic component wherein the at least one circumferentially-disposed, laterally-oriented, and electrically-conductive ring is positioned in proximity to a specific end of the pair of opposing, substantially parallel, and generally circular-shaped ends of the hollow, electrically-insulated, and generally circular-cylindrically-shaped housing, so that a lead of the pair of electrically-conductive axial leads that is in electrical communication with either the emitter of the bipolar transistor or the collector of the bipolar transistor can be readily identified by the lead of the pair of electrically-conductive axial leads exiting from the specific side of the pair of opposing, substantially parallel, and generally circular-shaped ends of the hollow, electrically-insulated, and generally circular-cylindrically-shaped housing to which the at least one of the at least one circumferentially-disposed, laterally-oriented, and electrically-conductive ring is most closest and thereby assuring proper placing, mounting, and connecting, whether automatic or manual, of the bipolar transistor that is contained in the hollow, electrically-insulated, and generally circular-cylindrically-shaped housing to the printed circuit board and thereby further assuring that proper polarity of the bipolar transistor is maintained and failure of the bipolar transistor is eliminated due to improper connecting thereof.

STILL YET ANOTHER OBJECT of the present invention is to provide a combination axial and surface mounted cylindrically-shaped package containing at least one electronic component wherein the at least one electronic component that is contained in the hollow, electrically-insulated, and generally circular-cylindrically-shaped housing is a tapped resistor with a pair of axial electrical terminals and at least one additional intermediate electrical terminal.

YET STILL ANOTHER OBJECT of the present invention is to provide a combination axial and surface mounted cylindrically-shaped package containing at least one electronic component wherein the pair of axial electrical terminals of the tapped resistor that is contained in the hollow, electrically-insulated, and generally circular-cylindrically-shaped housing is in electrical communication with the pair of electrically-conductive axial leads while each electrical terminal of the at least one additional intermediate electrical terminal of the tapped resistor is in electrical communication with a respective ring of the at least one the circumferentially-disposed, laterally-oriented, and electrically-conductive ring, via a corresponding throughbore of the at least one throughbore in the generally cylindrically-shaped longitudinal surface of the hollow, electrically-insulated, and generally circular-cylindrically-shaped housing.

STILL YET ANOTHER OBJECT of the present invention is to provide a combination axial and surface mounted cylindrically-shaped package containing at least one electronic component wherein the at least one electronic component that is contained in the hollow, electrically-insulated, and generally circular-cylindrically-shaped housing is a miniature circuit.

YET STILL ANOTHER OBJECT of the present invention is to provide a combination axial and surface mounted cylindrically-shaped package containing at least one electronic component wherein the printed circuit board has a plurality of plated throughbores that extend therethrough for establishing electrical communication between the at least one the circumferentially-disposed, laterally-oriented, and electrically conductive ring and the pair of electrically-conductive axial leads with the electrical lands of the printed circuit board.

STILL YET ANOTHER OBJECT of the present invention is to provide a combination axial and surface mounted cylindrically-shaped package containing at least one electronic component wherein each throughbore of the plurality of plated throughbores in the printed circuit board used for establishing electrical communication with the at least one circumferentially-disposed, laterally-oriented, and electrically-conductive ring is larger than each throughbore of the plurality of plated throughbores in the printed circuit board used for establishing electrical communication with the pair of electrically conductive axial leads, so that the area of contact therebetween is increased.

YET STILL ANOTHER OBJECT of the present invention is to provide a combination axial and surface mounted cylindrically-shaped package containing at least one electronic component wherein each throughbore of the plurality of plated throughbores in the printed circuit board used for establishing electrical communication with the at least one circumferentially-disposed, laterally-oriented, and electrically-conductive ring is elongated in shape to accommodate a larger portion of the at least one circumferentially-disposed, laterally-oriented, and electrically-conductive ring, so that greater mechanical support and a larger surface area for electrical communication therebetween is provided.

FINALLY, STILL YET ANOTHER OBJECT of the present invention is to provide a method of surface mounting at least one electronic component having a plurality of electrical terminals to a printed circuit board having electrical lands by using conventional cylindrically-shaped axial component through hole mounting machinery that includes the step of packaging the at least one electronic component in a combination axial and surface mounted cylindrically-shaped package which includes a hollow, electrically-insulated, and generally circular-cylindrically-shaped housing that has a generally cylindrically-shaped longitudinal outer surface and a longitudinal axis and contains the at least one electronic component, a pair of electrically-conductive axial leads that extend outwardly from the hollow, electrically-insulated, and generally circular-cylindrically-shaped housing along the longitudinal axis of the hollow, electrically-insulated, and generally circular-cylindrically-shaped housing and are in electrical communication with at least a portion of the plurality of electrical terminals of the at least one electronic component that is contained in the hollow, electrically-insulated, and generally circular-cylindrically-shaped housing wherein the pair of electrically-conductive axial leads are in electrical communication with the electrical lands of the printed circuit board, so that at least a portion of the plurality of electrical terminals of the at least one electronic component that is contained in the hollow, electrically-insulated, and generally circular-cylindrically-shaped housing is in electrical communication with the electrical lands of the printed circuit board, and at least one circumferentially-disposed, laterally-oriented, and electrically-conductive ring that is positioned on, concentric with, and encircles, the generally cylindrically-shaped longitudinal outer surface of the hollow, electrically-insulated, and generally circular-cylindrically-shaped housing and is in electrical communication with at least a portion of a remaining portion of the plurality of electrical terminals of the at least one electronic component that is contained in the hollow, electrically-insulated, and generally circular-cylindrically-shaped housing wherein the at least one circumferentially-disposed, laterally-oriented, and electrically-conductive ring is in electrical communication with the electrical lands of the printed circuit board, so that at least a portion of the remaining portion of the plurality of electrical terminals of the at least one electronic component that is contained in the hollow, electrically-insulated, and generally circular-cylindrically-shaped housing is in electrical communication with the electrical lands of the printed circuit board.

The novel features which are considered characteristic of the present invention are set forth in the appended claims. The invention itself, however, both as to its construction and its method of operation, together with additional objects and advantages thereof, will be best understood from the following description of the specific embodiments when read and understood in connection with the accompanying drawing.

BRIEF DESCRIPTION OF THE DRAWING

The figures on the drawing are briefly described as follows:

FIG. 1 is a diagrammatic perspective view of the present invention surface mounted to a conventional printed circuit board;

FIG. 2 is a diagrammatic perspective view of the present invention;

FIG. 3 is a diagrammatic perspective view of the present invention containing a transistor;

FIG. 4 is a diagrammatic side elevational view of present invention with the circumferentially-disposed, laterally-oriented, and electrically conductive ring positioned in proximity to a specific end of the hollow, electrically insulated, and generally circular-cylindrically-shaped housing;

FIG. 5 is a diagrammatic side elevational view of the present invention illustrating more than one circumferentially-disposed, laterally-oriented, and electrically conductive ring, with some shown in phantom, positioned on the hollow, electrically insulated, and generally circular-cylindrically-shaped housing;

Figure 6:
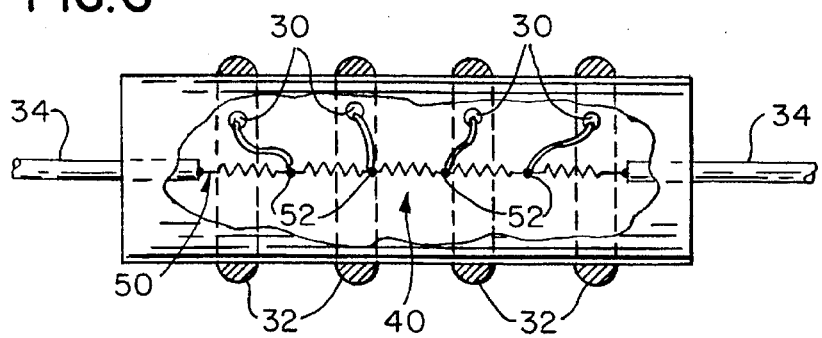
FIG. 6 is a diagrammatic side elevational view of the present invention containing a tapped resistor.

LIST OF REFERENCE NUMERALS UTILIZED IN THE DRAWING 10 surface mounted cylindrically-shaped package containing at least one electronic component of the present invention
12 printed circuit board
14 hollow, electrically-insulated, and generally circular-cylindrically-shaped housing
16 pair of housing opposing, substantially parallel, and generally circular-shaped ends
18 housing end centers
20 housing end perimeters
22 housing generally cylindrically-shaped longitudinal surface
24 housing longitudinal surface midpoint
26 housing longitudinal surface outer face
27 housing longitudinal axis
28 housing end centrally-disposed throughbore
30 housing longitudinal surface throughbore
32 circumferentially-disposed, laterally-oriented, and electrically-conductive ring
34 pair of electrically conductive axial leads
36 lead interior end
38 lead exterior end
40 at least one electronic component
42 bipolar transistor
44 bipolar transistor base
46 bipolar transistor emitter
48 bipolar transistor collector
50 tapped resistor
52 at least one additional tapped resistor electrical terminal
54 miniature circuit
56 plurality of miniature circuit electrical terminals
58 plurality of printed circuit board plated throughbores
60 printed circuit board plated throughbore metallically plated inner surface
62 printed circuit board electrically conductive interconnect lands
64 molten solder bath
66 solder

DETAILED DESCRIPTION OF THE PREFERRED EMBODIMENT

Referring now to the figures in which like numerals indicate like parts, and particularly to FIG. 1, the surface mounted cylindrically-shaped package containing at least one electronic component of the present invention is shown generally at 10 and is surface mounted to a printed circuit board 12.

The general configuration of the surface mounted cylindrically-shaped package containing at least one electronic component 10 can best be seen in FIG. 2, and as such will be discussed with reference thereto.

The surface mounted cylindrically-shaped package containing at least one electronic component 10 includes a hollow, electrically-insulated, and generally circular-cylindrically-shaped housing 14 that has a pair of housing opposing, substantially parallel, and generally circular-shaped ends 16 with housing end centers 18 and housing end perimeters 20, and a housing generally cylindrically-shaped longitudinal surface 22 that extends from the housing end perimeter 20 of one end of the pair of housing opposing, substantially parallel, and generally circular-shaped ends 16 of the hollow, electrically-insulated, and generally circular-cylindrically-shaped housing 14 to the housing end perimeter 20 of the other end of the pair of housing opposing, substantially parallel, and generally circular-shaped ends 16 of the hollow, electrically-insulated, and generally circular-cylindrically-shaped housing 14.

The housing generally cylindrically-shaped longitudinal surface 22 of the hollow, electrically-insulated, and generally circular-cylindrically-shaped housing 14 has a housing longitudinal surface midpoint 24 that is disposed midway between the pair of housing opposing, substantially parallel, and generally circular-shaped ends 16 of the hollow, electrically-insulated, and generally circular-cylindrically-shaped housing 14, and a housing longitudinal surface outer face 26.

The hollow, electrically-insulated, and generally circular-cylindrically-shaped housing 14 further has a housing longitudinal axis 27 that extends through the housing end centers 18 of the pair of housing opposing, substantially parallel, and generally circular-shaped ends 16 of the hollow, electrically-insulated, and generally circular-cylindrically-shaped housing 14.

It is to be understood that the circular-cylindrical shape of the hollow, electrically-insulated, and generally circular-cylindrically-shaped housing 14 is of critical importance and must be considered in determining patentability. The support for this assertion can be found in In re Dailey et al., 149 U.S.P.Q. at 47 (CCPA 1976), where the Court held that the shape of a device must be considered in determining patentability, if the shape is significant:

"... the configuration of the container is a 'mere matter of choice' not significantly novel. . . , [however,]. . . Appellants have provided no argument which convinces us that the <u>particular configuration</u> of their container is <u>significant</u> . . . " [Emphasis added].

The circular-cylindrical shape of the hollow, electrically-insulated, and generally circular-cylindrically-shaped housing 14 is significant since it replicates that of a conventional cylindrically-shaped axial component and thereby allows a normally non-cylindrically-shaped component to be packaged in a cylindrical-shaped package that can be surface mounted to a printed circuit board by use of conventional axial component through hole mounting machinery.

Furthermore, the circular-cylindrical shape of the hollow, electrically-insulated, and generally circular-cylindrically-shaped housing 14 is significant since its outer longitudinal surface is cylindrical and thereby allows the surface mounted cylindrically-shaped package containing at least one electronic component 10 to be mounted to the printed circuit board 12 with any part of its outer longitudinal surface positioned adjacent to the printed circuit board 12. There are no specific longitudinal surfaces that must be designated as the mounting sides, i.e. the surface mounted cylindrically-shaped package containing at least one electronic component 10 can be mounted with 360 degrees of rotational freedom about the housing longitudinal axis 27 of the hollow, electrically-insulated, and generally circular-cylindrically-shaped housing 14.

Each end of the pair of housing opposing, substantially parallel, and generally circular-shaped ends 16 of the hollow, electrically-insulated, and generally circular-cylindrically-shaped housing 14 has a housing end centrally-disposed throughbore 28 that extends therethrough at the housing end centers 18 of each of the pair of housing opposing, substantially parallel, and generally circular-shaped ends 16 of the hollow, electrically-insulated, and generally circular-cylindrically-shaped housing 14 and are in alignment with the housing longitudinal axis 27 of the hollow, electrically-insulated, and generally circular-cylindrically-shaped housing 14.

It is to be understood that each end of the pair of housing opposing, substantially parallel, and generally circular-shaped ends 16 of the hollow, electrically-insulated, and generally circular-cylindrically-shaped housing 14 may be flat, hemispherical or outwardly-conically-tapering without departing in any way from the spirit of the present invention.

The housing generally cylindrically-shaped longitudinal surface 22 of the hollow, electrically-insulated, and generally circular-cylindrically-shaped housing 14 has a housing longitudinal surface throughbore 30 that extends through the housing generally cylindrically-shaped longitudinal surface 22 of the hollow, electrically-insulated, and generally circular-cylindrically-shaped housing 14 at the housing longitudinal surface midpoint 24 of the housing generally cylindrically-shaped longitudinal surface 22 of the hollow, electrically-insulated, and generally circular-cylindrically-shaped housing 14.

The surface mounted cylindrically-shaped package containing at least one electronic component 10 further includes a circumferentially-disposed, laterally-oriented, and electrically-conductive ring 32 that is disposed circumferentially and laterally on, encircles, and is concentric with, the housing longitudinal surface outer face 26 of the housing generally cylindrically-shaped longitudinal surface 22 of the hollow, electrically insulated, and generally circular-cylindrically-shaped housing 14, at the housing longitudinal surface midpoint 24 of the housing generally cylindrically-shaped longitudinal surface 22 of the hollow, electrically-insulated, and generally circular-cylindrically-shaped housing 14 and covers the housing longitudinal surface throughbore 30 in the housing generally cylindrically-shaped longitudinal surface 22 of the hollow, electrically-insulated, and generally circular-cylindrically-shaped housing 14.

The surface mounted cylindrically-shaped package containing at least one electronic component 10 further includes a pair of electrically conductive axial leads 34. Each lead of the pair of electrically conductive axial leads 34 has a lead interior end 36 and a lead exterior end 38 and passes axially through, and is sealed to, a respective housing end centrally-disposed throughbore 28 in the pair of housing opposing, substantially parallel, and generally circular-shaped ends 16 of the hollow, electrically-insulated, and generally circular-cylindrically-shaped housing 14 with the lead interior end 36 of each of the pair of electrically conductive axial leads 34 disposed in the hollow, electrically-insulated, and generally circular-cylindrically-shaped housing 14 and the lead exterior end 38 of each of the pair of electrically conductive axial leads 34 disposed outside the hollow, electrically-insulated, and generally circular-cylindrically-shaped housing 14.

The surface mounted cylindrical-shaped package containing at least one electronic component 10 further includes at least one electronic component 40 which is contained in the hollow, electrically-insulated, and generally circular-cylindrically-shaped housing 14.

The at least one electronic component 40 contained in the hollow, electrically-insulated, and generally circular-cylindrically-shaped housing 14 is in electrical communication with the circumferentially-disposed, laterally-oriented, and electrically-conductive ring 32, via the housing longitudinal surface throughbore 30 in the housing generally cylindrically-shaped longitudinal surface 22 of the hollow, electrically-insulated, and generally circular-cylindrically-shaped housing 14, and which is also in electrical communication with the interior end 36 of each lead of each of the pair of electrically conductive axial leads 34.

As shown in FIG. 3, the at least one electronic component 40 contained in the hollow, electrically-insulated, and generally circular-cylindrically-shaped housing 14 can be a bipolar transistor 42 with a bipolar transistor base 44, a bipolar transistor emitter 46, and a bipolar transistor collector 48.

The bipolar transistor base 44 of the bipolar transistor 42 is in electrical communication with the circumferentially-disposed, laterally-oriented, and electrically-conductive ring 32, via the housing longitudinal surface throughbore 30 in the housing generally cylindrically-shaped longitudinal surface 22 of the hollow, electrically-insulated, and generally circular-cylindrically-shaped housing 14.

The bipolar transistor emitter 46 of the bipolar transistor 42 is in electrical communication with one lead of the pair of electrically conductive axial leads 34, via the lead interior end 36 of the respective lead of the pair of electrically conductive axial leads 34.

The bipolar transistor collector 48 of the bipolar transistor 42 is in electrical communication with the other lead of the pair of electrically conductive axial leads 34, via the lead interior end 36 of the other lead of the pair of electrically conductive axial leads 34.

As shown in FIG. 4, and also with reference to the bipolar transistor 42 contained in the hollow, electrically-insulated, and generally circular-cylindrically-shaped housing 14, an alternative to placing the housing longitudinal surface throughbore 30 in the housing generally cylindrically-shaped longitudinal surface 22 of the hollow, electrically-insulated, and generally circular-cylindrically-shaped housing 14 at the housing longitudinal surface midpoint 24 of the housing generally cylindrically-shaped longitudinal surface 22 of the hollow, electrically-insulated, and generally circular-cylindrically-shaped housing 14, the housing longitudinal surface throughbore 30 in the housing generally cylindrically-shaped longitudinal surface 22 of the hollow, electrically-insulated, and generally circular-cylindrically-shaped housing 14 can be placed in proximity to a specific end of the pair of housing opposing, substantially parallel, and generally circular-shaped ends 16 of the hollow, electrically-insulated, and generally circular-cylindrically-shaped housing 14.

The circumferentially-disposed, laterally-oriented, and electrically-conductive ring 32 is then accordingly positioned also in proximity to the specific end of the pair of housing opposing, substantially parallel, and generally circular-shaped ends 16 of the hollow, electrically-insulated, and generally circular-cylindrically-shaped housing 14 and covers the housing longitudinal surface throughbore 30 in the housing generally cylindrically-shaped longitudinal surface 22 of the hollow, electrically-insulated, and generally circular-cylindrically-shaped housing 14.

With this arrangement, the lead of the pair of electrically conductive axial leads 34 representing either the bipolar transistor emitter 46 of the bipolar transistor 42 or the bipolar transistor collector 48 of the bipolar transistor 42 can be readily identified by the lead of the pair of electrically conductive axial leads 34 exiting from the side of the pair of housing opposing, substantially parallel, and generally circular-shaped ends 16 of the hollow, electrically-insulated, and generally circular-cylindrically-shaped housing 14 to which the circumferentially-disposed, laterally-oriented, and electrically-conductive ring 32 is most closest. This will assure proper placing, mounting, and connecting, whether automatic or manual, of the bipolar transistor 42 contained in the hollow, electrically-insulated, and generally circular-cylindrically-shaped housing 14 to the printed circuit board 12, so that proper polarity of the bipolar transistor 42 is assured and failure of the bipolar transistor 42 is eliminated due to improper connecting thereof.

As discussed supra, the circumferentially-disposed, laterally-oriented, and electrically-conductive ring 32 is used as an electrical terminal of the at least one electronic component 40 contained in the hollow, electrically-insulated, and generally circular-cylindrically-shaped housing 14 when the at least one electronic component 40 requires a third electrical terminal in addition to the two electrical terminals provided by the pair of electrically conductive axial leads 34.

What happens, however, when the at least one electronic component 40 contained in the hollow, electrically-insulated, and generally circular-cylindrically-shaped housing 14 requires more than three electrical terminals thereto? The situation can be easily remedied by the utilization of more than one circumferentially-disposed, laterally-oriented, and electrically-conductive ring 32 that can be preferably parallel to, and equally spaced apart from, each other.

As shown in FIG. 5, N-rings, some shown in phantom for illustrative purposes, of the circumferentially-disposed, laterally-oriented, and electrically-conductive ring 32 are parallel and spaced-apart and disposed longitudinally on the housing longitudinal surface outer face 26 of the housing generally cylindrically-shaped longitudinal surface 22 of the hollow, electrically insulated, and generally circular-cylindrically-shaped housing 14 and cover N-corresponding throughbores of the housing longitudinal surface throughbore 30 in the housing generally cylindrically-shaped longitudinal surface 22 of the hollow, electrically-insulated, and generally circular-cylindrically-shaped housing 14.

The N-corresponding throughbores of the housing longitudinal surface throughbore 30 in the housing generally cylindrically-shaped longitudinal surface 22 of the hollow, electrically-insulated, and generally circular-cylindrically-shaped housing 14 are positioned in the housing generally cylindrically-shaped longitudinal surface 22 of the hollow, electrically-insulated, and generally circular-cylindrically-shaped housing 14 at positions corresponding to the placement of the N-rings of the circumferentially-disposed, laterally-oriented, and electrically-conductive ring 32.

For example, as shown in FIG. 6, the at least one electronic component 40 contained in the hollow, electrically-insulated, and generally circular-cylindrically-shaped housing 14 can be a tapped resistor 50, which by definition includes at least one additional tapped resistor electrical terminal 52 disposed therealong, as stated in "Modern Dictionary of Electronics" by Rudolf F. Graf at page 729:

"tapped resistor-A wirewound fixed resistor having <u>one or more additional terminals alongits length</u>."
[Emphasis added]

The tapped resistor 50 contained in the hollow, electrically-insulated, and generally circular-cylindrically-shaped housing 14 is in electrical communication with the pair of electrically conductive axial leads 34 as in conventional practice, while each additional electrical terminal of the at least one additional tapped resistor electrical terminal 52 of the tapped resistor 50 is in electrical communication with a respective ring of the N-rings of the circumferentially-disposed, laterally-oriented, and electrically-conductive ring 32, via a corresponding throughbore of the N-corresponding throughbores of the housing longitudinal surface throughbore 30 in the housing generally cylindrically-shaped longitudinal surface 22 of the hollow, electrically-insulated, and generally circular-cylindrically-shaped housing 14.

Figure 7:
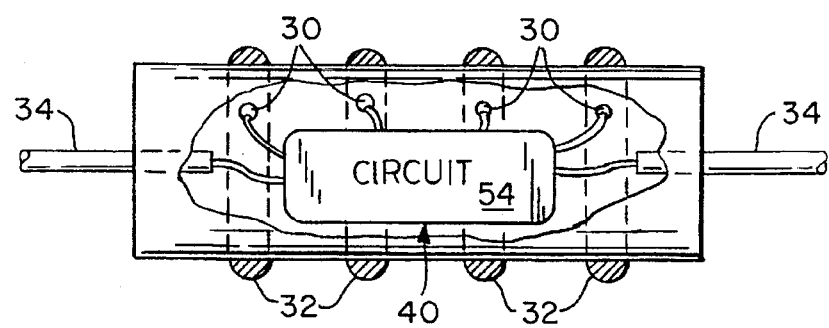
FIG. 7 is a diagrammatic side elevational view of the present invention containing a miniature circuit.

Another example, as shown in FIG. 7, the at least one electronic component 40 contained in the hollow, electrically-insulated, and generally circular-cylindrically-shaped housing 14 can be a miniature circuit 54 with a plurality of miniature circuit electrical terminals 56.

Two electrical terminals of the plurality of miniature circuit electrical terminals 56 of the miniature circuit 54 contained in the hollow, electrically-insulated, and generally circular-cylindrically-shaped housing 14 are in electrical communication with the pair of electrically conductive axial leads 34, while each additional electrical terminal of the plurality of miniature circuit electrical terminals 56 of the miniature circuit 54 is in electrical communication with a respective ring of the N-rings of the circumferentially-disposed, laterally-oriented, and electrically-conductive ring 32, via a corresponding throughbore of the N-corresponding throughbores of the housing longitudinal surface throughbore 30 in the housing generally cylindrically-shaped longitudinal surface 22 of the hollow, electrically-insulated, and generally circular-cylindrically-shaped housing 14.

It is to be understood that the number of N-rings of the circumferentially-disposed, laterally-oriented, and electrically-conductive ring 32 is limited only by the size of the at least one electronic component 40 and the precision and tolerance of the conventional axial component through hole mounting machinery utilized for the insertion thereof.

The general manner in which the surface mounted cylindrically-shaped package containing at least one electronic component 10 is surface mounted to a printed circuit board 12 can best be seen in FIGS. 1, 8, and 9, and as such will be discussed with reference thereto.

Figure 8:
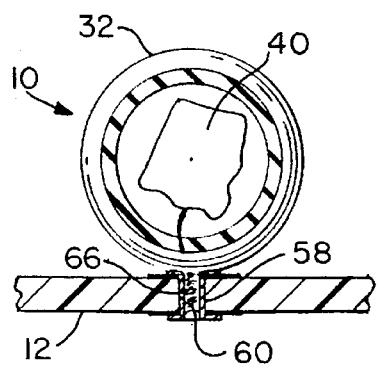
FIG. 8 is an enlarged cross sectional view taken on line 8—8 of FIG. 1.

As shown in FIGS. 1 and 8, the printed circuit board 12 has a plurality of printed circuit board plated throughbores 58 extending therethrough.

It is to be understood that the throughbore of the plurality of printed circuit board plated throughbores 58 in the printed circuit board 12 used for establishing electrical communication with the circumferentially-disposed, laterally-oriented, and electrically-conductive ring 32 may be larger than the throughbores of the plurality of printed circuit board plated throughbores 58 in the printed circuit board 12 used for establishing electrical communication with the pair of electrically conductive axial leads 34, to increase the area of contact between the throughbore of the plurality of printed circuit board plated throughbores 58 in the printed circuit board 12 used for establishing electrical communication with the circumferentially-disposed, laterally-oriented, and electrically-conductive ring 32 and the circumferentially-disposed, laterally-oriented, and electrically-conductive ring 32, without departing in any way from the spirit of the present invention.

It is to be understood further that the throughbore of the plurality of printed circuit board plated throughbores 58 in the printed circuit board 12 used for establishing electrical communication with the circumferentially-disposed, laterally-oriented, and electrically-conductive ring 32 may be elongated in shape to accommodate a larger portion of the circumferentially-disposed, laterally-oriented, and electrically-conductive ring 32 for providing greater mechanical support and a larger surface area for electrical communication therebetween, again without departing in any way from the spirit of the present invention.

As shown in FIG. 8, each throughbore of the plurality of printed circuit board plated throughbores 58 in the printed circuit board 12 has a printed circuit board plated throughbore metallically plated inner surface 60, and is in electrical communication with each other by printed circuit board electrically conductive interconnect lands 62 of the printed circuit board 12 (see FIG. 1).

As shown specifically in FIG. 1, the pair of electrically conductive axial leads 34 are bent normally downwardly toward the printed circuit board 12 with the pair of electrically conductive axial leads 34 extending into, and in electrical communication with, a pair of the plurality of printed circuit board plated throughbores 58 in the printed circuit board 12, so that not only are the pair of electrically conductive axial leads 34 in electrical communication with the respective electrical terminals of the at least one component 40 contained in the hollow, electrically-insulated, and generally circular-cylindrically-shaped housing 14 as discussed supra, but the pair of electrically conductive axial leads 34 are also in electrical communication with the respective printed circuit board electrically conductive interconnect lands 62 of the printed circuit board 12 thereby allowing two of the electrical terminals of the at least one component 40 contained in the hollow, electrically-insulated, and generally circular-cylindrically-shaped housing 14 to be in electrical communication with the respective printed circuit board electrically conductive interconnect lands 62 of the printed circuit board 12.

Each circumferentially-disposed, laterally-oriented, and electrically-conductive ring 32 contacts, and is in electrical communication with, a respective throughbore of the plurality of printed circuit board plated throughbores 58 in the printed circuit board 12 (see FIG. 8), so that not only is each circumferentially-disposed, laterally-oriented, and electrically-conductive ring 32 in electrical communication with the remaining electrical terminals of the at least one component 40 contained in the hollow, electrically-insulated, and generally circular-cylindrically-shaped housing 14 as discussed supra, but each circumferentially-disposed, laterally-oriented, and electrically-conductive ring 32 is also in electrical communication with the respective printed circuit board electrically conductive interconnect lands 62 of the printed circuit board 12 thereby allowing the remaining electrical terminals of the at least one component 40 contained in the hollow, electrically-insulated, and generally circular-cylindrically-shaped housing 14 to be in electrical communication with the respective printed circuit board electrically conductive interconnect lands 62 of the printed circuit board 12.

Figure 9:
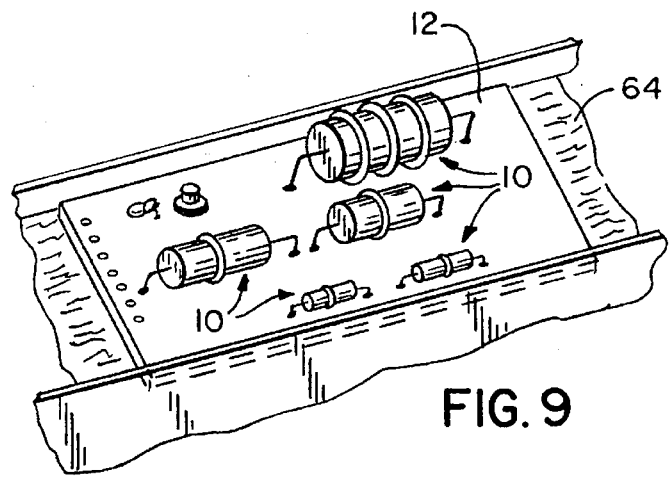
FIG. 9 is a diagrammatic perspective view of a printed circuit board having the various embodiments of the present invention being wave soldered thereon.

As shown in FIGS. 8 and 9, the surface mounted cylindrically-shaped package containing at least one electronic component 10 is wave soldered to the printed circuit board 12. The printed circuit board 12 with at least one surface mounted cylindrically-shaped package containing at least one electronic component 10 positioned thereon, is dipped into an anti-oxidizing or "flux" bath.

After thoroughly coating the metallic surfaces of the printed circuit board 12 with the anti-oxidant, the printed circuit board 12 is dipped into a molten solder bath 64, to a depth necessary to allow solder 66 to adhere to all the desired metallic surfaces of the printed circuit board 12.

As shown in FIG. 8, with particularly to the throughbores of the plurality of printed circuit board plated throughbores 58 in the printed circuit board 12 on which each circumferentially-disposed, laterally-oriented, and electrically-conductive ring 32 contacts and is in electrical communication with, but also to the throughbores of the plurality of printed circuit board plated throughbores 58 in the printed circuit board 12 through which the pair of electrically conductive axial leads 34 pass and are in electrical communication with, the solder 66 wicks up therethrough and provides a secure electrical connection between each circumferentially-disposed, laterally-oriented, and electrically-conductive ring 32 and each of the pair of electrically conductive axial leads 34 with the respective throughbore of the plurality of printed circuit board plated throughbores 58 in the printed circuit board 12.

It is to be understood that the use of the plurality of printed circuit board throughbores 58 in the printed circuit board 12, the printed circuit board electrically conductive interconnect lands 62 of the printed circuit board 12, and the wave soldering operation are conventional in nature and are only discussed as an aide in understanding the interface between the surface mounted cylindrically-shaped package containing at least one electronic component 10 and the printed circuit board 12.

In summation, applicant has provided a means for surface mounting at least one electronic component to a printed circuit board by using conventional cylindrically-shaped axial component through hole mounting machinery by packaging the at least one electronic component in a combination axial and surface mounted cylindrically-shaped package.

The surface mounted cylindrically-shaped package includes a hollow, electrically-insulated, and generally circular-cylindrically-shaped housing that has a longitudinal cylindrically-shaped outer surface and a longitudinal axis and contains the at least one electronic component.

The surface mounted cylindrically-shaped package further includes a pair of electrical axial leads that extend outwardly from the hollow, electrically-insulated, and generally circular-cylindrically-shaped housing along the longitudinal axis of the hollow, electrically-insulated, and generally circular-cylindrically-shaped housing and which are in electrical communication with at least a portion of the plurality of electrical terminals of the at least one electronic component that is contained in the hollow, electrically-insulated, and generally circular-cylindrically-shaped housing wherein the pair of electrical axial leads are in electrical communication with the lands of a printed circuit board, so that at least a portion of the plurality of electrical terminals of the at least one electronic component that is contained in the hollow, electrically-insulated, and generally circular-cylindrically-shaped housing are in electrical communication with the lands of the printed circuit board.

The surface mounted cylindrically-shaped package further includes at least one circumferentially-disposed, laterally-oriented, and electrically-conductive ring that is positioned on and encircles the longitudinal outer surface of the hollow, electrically-insulated, and generally circular-cylindrically-shaped housing and is in electrical communication with at least a portion of the remaining portion of the plurality of electrical terminals of the at least one electronic component that is contained in the hollow, electrically-insulated, and generally circular-cylindrically-shaped housing wherein the at least one circumferentially-disposed, laterally-oriented, and electrically-conductive ring is in electrical communication with the lands of the printed circuit board, so that at least a portion of the remaining portion of the plurality of electrical terminals of the at least one electronic component that is contained in the hollow, electrically-insulated, and generally circular-cylindrically-shaped housing are in electrical communication with the lands of the printed circuit board.

It will be understood that each of the elements described above, or two or more together, may also find a useful application in other types of constructions differing from the types described above.

While the invention has been illustrated and described as embodied in a combination axial and surface mounted cylindrically-shaped package containing at least one electronic component, it is not limited to the details shown, since it will be understood that various omissions, modifications, substitutions and changes in the forms and details of the device illustrated and its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute characteristics of the generic or specific aspects of this invention.

The invention claimed is:

1. A combination axial and surface mounted cylindrically-shaped package containing at least one electronic component and being surface mountable to a printed circuit board with electrical lands by the use of conventional axial component through hole mounting machinery, comprising:

a) a hollow, electrically-insulated, and generally circular-cylindrically-shaped housing having a longitudinal axis, and a generally cylindrically-shaped longitudinal surface with an outer face; said hollow, electrically-insulated, and generally circular-cylindrically-shaped housing replicating a conventional cylindrically-shaped electronic axial component and thereby allowing a normally non-cylindrically-shaped electronic component to be packaged in said hollow, electrically-insulated, and generally circular-cylindrically-shaped housing to be surface mounted to the printed circuit board by use of the conventional axial component through hole mounting machinery; said generally cylindrically-shaped longitudinal surface of said hollow, electrically-insulated, and generally circular-cylindrically-shaped housing being cylindrical and thereby allowing said hollow, electrically-insulated, and generally circular-cylindrically-shaped housing containing said at least one electronic component to be mounted to the printed circuit board with any part of said generally cylindrically-shaped longitudinal surface of said hollow, electrically-insulated, and generally circular-cylindrically-shaped housing being positioned adjacent to the printed circuit board, so that said hollow, electrically-insulated, and generally circular-cylindrically-shaped housing can be surface mounted to the printed circuit board with 360 degrees of rotational freedom about said longitudinal axis of said hollow, electrically-insulated, and generally circular-cylindrically-shaped housing;

b) at least one electronic component being contained in said hollow, electrically-insulated, and generally circular-cylindrically-shaped housing and having a plurality of electrical terminals;

c) a pair of electrically-conductive axial leads extending outwardly from said hollow, electrically-insulated, and generally circular-cylindrically-shaped housing along said longitudinal axis of said hollow, electrically-insulated, and generally circular-cylindrically-shaped housing and being in electrical communication with at least a portion of said plurality of electrical terminals of said at least one electronic component being contained in said hollow, electrically-insulated, and generally circular-cylindrically-shaped housing; said pair of electrically-conductive axial leads being in electrical communication with the electrical lands of the printed circuit board, so that said at least a portion of said plurality of electrical terminals of said at least one electronic component that is contained in said hollow, electrically-insulated, and generally circular-cylindrically-shaped housing is in electrical communication with the electrical lands of the printed circuit board; and d) at least one circumferentially-disposed, laterally-oriented, and electrically-conductive ring being positioned on, concentric with, and encircling said outer face of said longitudinal surface of said hollow, electrically-insulated, and generally circular-cylindrically-shaped housing and being in electrical communication with at least a portion of a remaining portion of said plurality of electrical terminals of said at least one electronic component being contained in said hollow, electrically-insulated, and generally circular-cylindrically-shaped housing; said at least one circumferentially-disposed, laterally-oriented, and electrically-conductive ring being in electrical communication with the electrical lands of the printed circuit board, so that said at least a portion of said remaining portion of said plurality of electrical terminals of said at least one electronic component that is contained in said hollow, electrically-insulated, and generally circular-cylindrically-shaped housing is in electrical communication with the electrical lands of the printed circuit board.

2. The package as defined in claim 1, wherein said hollow, electrically-insulated, and generally circular-cylindrically-shaped housing has a pair of opposing, substantially parallel, and generally circular-shaped ends with centers and perimeters; said generally cylindrically-shaped longitudinal surface of said hollow, electrically-insulated, and generally circular-cylindrically-shaped housing extends from said perimeter of one end of said pair of opposing, substantially parallel, and generally circular-shaped ends of said hollow, electrically-insulated, and generally circular-cylindrically-shaped housing to said perimeter of another end of said pair of opposing, substantially parallel, and generally circular-shaped ends of said hollow, electrically-insulated, and generally circular-cylindrically-shaped housing.

3. The package as defined in claim 2, wherein each of said pair of opposing, substantially parallel, and generally circular-shaped ends of said hollow, electrically-insulated, and generally circular-cylindrically-shaped housing is selected from the group consisting of flat, hemispherical, and conical.

4. The package as defined in claim 2, wherein said generally cylindrically-shaped longitudinal surface of said hollow, electrically-insulated, and generally circular-cylindrically-shaped housing has a midpoint that is disposed midway between said pair of opposing, substantially parallel, and generally circular-shaped ends of said hollow, electrically-insulated, and generally circular-cylindrically-shaped housing.

5. The package as defined in claim 4, wherein said generally cylindrically-shaped longitudinal surface of said hollow, electrically-insulated, and generally circular-cylindrically-shaped housing further has at least one throughbore disposed therein and that extends therethrough.

6. The package as defined in claim 5, wherein said at least one circumferentially-disposed, laterally-oriented, and electrically-conductive ring covers a respective said at least one throughbore in said generally cylindrically-shaped longitudinal surface of said hollow, electrically-insulated, and generally circular-cylindrically-shaped housing.

7. The package as defined in claim 6, wherein said at least one circumferentially-disposed, laterally-oriented, and electrically-conductive ring is disposed at said midpoint of said generally cylindrically-shaped longitudinal surface of said hollow, electrically-insulated, and generally circular-cylindrically-shaped housing.

8. The package as defined in claim 6, wherein each lead of said pair of electrically-conductive axial leads has an interior end and an exterior end and passes axially through, and is sealed to, a respective said centrally-disposed throughbore in said pair of opposing, substantially parallel, and generally circular-shaped ends of said hollow, electrically-insulated, and generally circular-cylindrically-shaped housing with said interior end of each of said pair of electrically-conductive axial leads disposed in said hollow, electrically-insulated, and generally circular-cylindrically-shaped housing and with said exterior end of each of said pair of electrically-conductive axial leads disposed outside said hollow, electrically-insulated, and generally circular-cylindrically-shaped housing.

9. The package as defined in claim 8, wherein said at least one electronic component that is contained in said hollow, electrically-insulated, and generally circular-cylindrically-shaped housing is in electrical communication with said at least one circumferentially-disposed, laterally-oriented, and electrically-conductive ring, via said at least one throughbore in said generally cylindrically-shaped longitudinal surface of said hollow, electrically-insulated, and generally circular-cylindrically-shaped housing; said at least one electronic component that is contained in said hollow, electrically-insulated, and generally circular-cylindrically-shaped housing being also in electrical communication with said interior end of each lead of each of said pair of electrically-conductive axial leads.

10. The package as defined in claim 9, wherein said at least one electronic component that is contained in said hollow, electrically-insulated, and generally circular-cylindrically-shaped housing is a bipolar transistor with a base, an emitter, and a collector; said base of said bipolar transistor is in electrical communication with at least one of said at least one circumferentially-disposed, laterally-oriented, and electrically-conductive ring, via a corresponding said at least one throughbore in said generally cylindrically-shaped longitudinal surface of said hollow, electrically-insulated, and generally circular-cylindrically-shaped housing; said emitter of said bipolar transistor is in electrical communication with one lead of said pair of electrically-conductive axial leads, via said interior end of said one lead of said pair of electrically-conductive axial leads; said collector of said bipolar transistor is in electrical communication with another lead of said pair of electrically-conductive axial leads, via said interior end of said another lead of said pair of electrically-conductive axial leads.

11. The package as defined in claim 10, wherein said at least one circumferentially-disposed, laterally-oriented, and electrically-conductive ring is positioned in proximity to a specific end of said pair of opposing, substantially parallel, and generally circular-shaped ends of said hollow, electrically-insulated, and generally circular-cylindrically-shaped housing, so that a lead of said pair of electrically-conductive axial leads that is in electrical communication with either said emitter of said bipolar transistor or said collector of said bipolar transistor can be readily identified by said lead of said pair of electrically-conductive axial leads exiting from said specific side of said pair of opposing, substantially parallel, and generally circular-shaped ends of said hollow, electrically-insulated, and generally circular-cylindrically-shaped housing to which said at least one of said at least one circumferentially-disposed, laterally-oriented, and electrically-conductive ring is most closest and thereby assuring proper placing, mounting, and connecting, whether automatic or manual, of said bipolar transistor that is contained in said hollow, electrically-insulated, and generally circular-cylindrically-shaped housing to the printed circuit board and thereby further assuring that proper polarity of said bipolar transistor is maintained and failure of said bipolar transistor is eliminated due to improper connecting thereof.

12. The package as defined in claim 9, wherein said at least one electronic component that is contained in said hollow, electrically-insulated, and generally circular-cylindrically-shaped housing is a tapped resistor with a pair of axial electrical terminals and at least one additional intermediate electrical terminal; said pair of axial electrical terminals of said tapped resistor that is contained in said hollow, electrically-insulated, and generally circular-cylindrically-shaped housing is in electrical communication with said pair of electrically-conductive axial leads while each electrical terminal of said at least one additional intermediate electrical terminal of said tapped resistor is in electrical communication with a respective ring of said at least one said circumferentially-disposed, laterally-oriented, and electrically-conductive ring, via a corresponding throughbore of said at least one throughbore in said generally cylindrically-shaped longitudinal surface of said hollow, electrically-insulated, and generally circular-cylindrically-shaped housing.

13. The package as defined in claim 9, wherein said at least one electronic component that is contained in said hollow, electrically-insulated, and generally circular-cylindrically-shaped housing is a miniature circuit.

14. The package as defined in claim 2, wherein said longitudinal axis of said hollow, electrically-insulated, and generally circular-cylindrically-shaped housing extends through said centers of said pair of opposing, substantially parallel, and generally circular-shaped ends of said hollow, electrically-insulated, and generally circular-cylindrically-shaped housing.

15. The package as defined in claim 14, wherein each end of said pair of opposing, substantially parallel, and generally circular-shaped ends of said hollow, electrically-insulated, and generally circular-cylindrically-shaped housing has a centrally-disposed throughbore that extends therethrough at said center of each of said pair of opposing, substantially parallel, and generally circular-shaped ends of said hollow, electrically-insulated, and generally circular-cylindrically-shaped housing and are in alignment with said longitudinal axis of said hollow, electrically-insulated, and generally circular-cylindrically-shaped housing.

16. The package as defined in claim 1, wherein the printed circuit board has a plurality of plated throughbores that extend therethrough for establishing electrical communication between said at least one said circumferentially-disposed, laterally-oriented, and electrically-conductive ring and said pair of electrically-conductive axial leads with the electrical lands of the printed circuit board.

17. The package as defined in claim 16, wherein each throughbore of said plurality of plated throughbores in the printed circuit board used for establishing electrical communication with said at least one circumferentially-disposed, laterally-oriented, and electrically-conductive ring is larger than each throughbore of said plurality of plated throughbores in the printed circuit board used for establishing electrical communication with said pair of electrically conductive axial leads, so that the area of contact therebetween is increased.

18. The package as defined in claim 17, wherein each throughbore of said plurality of plated throughbores in the printed circuit board used for establishing electrical communication with said at least one circumferentially-disposed, laterally-oriented, and electrically-conductive ring is elongated in shape to accommodate a larger portion of said at least one circumferentially-disposed, laterally-oriented, and electrically-conductive ring, so that greater mechanical support and a larger surface area for electrical communication therebetween is provided.

19. A method of surface mounting at least one electronic component having a plurality of electrical terminals to a printed circuit board having electrical lands by using conventional cylindrically-shaped axial component through hole mounting machinery, comprising the step of packaging said at least one electronic component in a combination axial and surface mounted cylindrically-shaped package which comprises:

a) a hollow, electrically-insulated, and generally circular-cylindrically-shaped housing having a generally cylindrically-shaped longitudinal outer surface and a longitudinal axis and containing said at least one electronic component;

b) a pair of electrically-conductive axial leads extending outwardly from said hollow, electrically-insulated, and generally circular-cylindrically-shaped housing along said longitudinal axis of said hollow, electrically-insulated, and generally circular-cylindrically-shaped housing and being in electrical communication with at least a portion of said plurality of electrical terminals of said at least one electronic component being contained in said hollow, electrically-insulated, and generally circular-cylindrically-shaped housing wherein said pair of electrically-conductive axial leads are in electrical communication with the electrical lands of the printed circuit board, so that at least a portion of said plurality of electrical terminals of said at least one electronic component that is contained in said hollow, electrically-insulated, and generally circular-cylindrically-shaped housing is in electrical communication with the electrical lands of the printed circuit board; and c) at least one circumferentially-disposed, laterally-oriented, and electrically-conductive ring being positioned on, concentric with, and encircling, said generally cylindrically-shaped longitudinal outer surface of said hollow, electrically-insulated, and generally circular-cylindrically-shaped housing and being in electrical communication with at least a portion of a remaining portion of said plurality of electrical terminals of said at least one electronic component being contained in said hollow, electrically-insulated, and generally circular-cylindrically-shaped housing wherein said at least one circumferentially-disposed, laterally-oriented, and electrically-conductive ring is in electrical communication with the electrical lands of the printed circuit board, so that said at least a portion of said remaining portion of said plurality of electrical terminals of said at least one electronic component that is contained in said hollow, electrically-insulated, and generally circular-cylindrically-shaped housing is in electrical communication with the electrical lands of the printed circuit board.

* * * * *